(12) United States Patent
Senshu et al.

(10) Patent No.: US 12,386,276 B2
(45) Date of Patent: Aug. 12, 2025

(54) DETECTION DEVICE, DETECTION METHOD, LITHOGRAPHY APPARATUS, AND ARTICLE MANUFACTURING METHOD

(71) Applicant: CANON KABUSHIKI KAISHA, Tokyo (JP)

(72) Inventors: Kohei Senshu, Tokyo (JP); Toshiki Iwai, Saitama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 65 days.

(21) Appl. No.: 18/449,779

(22) Filed: Aug. 15, 2023

(65) Prior Publication Data

US 2024/0069455 A1    Feb. 29, 2024

(30) Foreign Application Priority Data

Aug. 24, 2022  (JP) .................................. 2022-133518

(51) Int. Cl.
G03F 9/00 (2006.01)
G03F 7/00 (2006.01)
G06T 7/73 (2017.01)

(52) U.S. Cl.
CPC .......... *G03F 9/7069* (2013.01); *G03F 7/0002* (2013.01); *G03F 9/7015* (2013.01); *G06T 7/73* (2017.01)

(58) Field of Classification Search
CPC .... G03F 7/0002; G03F 9/7015; G03F 9/7069; G03F 9/7042; G06T 7/73
See application file for complete search history.

(56) References Cited

U.S. PATENT DOCUMENTS

| 5,502,311 | A  | * | 3/1996 | Imai | ...................... | G03F 9/7026 |
| | | | | | | 250/548 |
| 5,726,739 | A  | * | 3/1998 | Hayata | ................ | G03F 7/70066 |
| | | | | | | 250/548 |
| 6,091,075 | A  | * | 7/2000 | Shibata | ................ | G02B 21/241 |
| | | | | | | 250/559.44 |
| 7,292,326 | B2 | | 11/2007 | Nimmakayala et al. | | |
| 2005/0079428 | A1 | * | 4/2005 | Kanno | ................ | G03F 7/70641 |
| | | | | | | 430/30 |

(Continued)

FOREIGN PATENT DOCUMENTS

JP    2008522412 A   6/2008
WO   2007046820 A2   4/2007

*Primary Examiner* — Deoram Persaud
(74) *Attorney, Agent, or Firm* — ROSSI, KIMMS & McDOWELL LLP (57) ABSTRACT

Device detects a relative position between first and second marks arranged to be superimposed The device includes illumination system to illuminate the first and second marks with first illumination light, first detection system including first image sensor and first aperture stop and configured to form images of diffracted lights from the first and second marks illuminated with the first illumination light on the first image sensor via the first aperture stop, and processor to obtain the relative position between the first and second marks. The first illumination light forms first light intensity distribution asymmetric with respect to the optical axis of the illumination system on pupil surface of the illumination system, or the first aperture stop is asymmetric with respect to the optical axis of the first detection system.

19 Claims, 8 Drawing Sheets

(56) References Cited

U.S. PATENT DOCUMENTS

2006/0203232 A1* 9/2006 Okita ............... G03F 7/70591
356/601
2007/0260419 A1* 11/2007 Hagiwara ............ G03F 9/7069
382/141
2014/0240687 A1* 8/2014 Sato ............... G03F 7/70725
355/77
2015/0235880 A1* 8/2015 Inada ................ G06T 7/0004
348/87

* cited by examiner

DETECTION DEVICE, DETECTION METHOD, LITHOGRAPHY APPARATUS, AND ARTICLE MANUFACTURING METHOD

BACKGROUND OF THE INVENTION

Field of the Invention

The present invention relates to a detection device, a detection method, a lithography apparatus, and an article manufacturing method.

Description of the Related Art

An imprint apparatus brings a mold into contact with an imprint material arranged on a substrate, and cures the imprint material, thereby forming a pattern made of a cured product of the imprint material. In this imprint apparatus, it is important to correctly align the substrate and the mold. Japanese Patent Laid-Open No. 2008-522412 describes a technique of aligning a substrate and a mold using a mark formed by a diffraction grating provided on the substrate and a mark formed by a diffraction grating provided on the mold.

If defocus exists in a detection system including an image sensor configured to capture an image formed by a first mark and a second mark provided on a first object and a second object, respectively, the defocus is reflected on the position of the image.

SUMMARY OF THE INVENTION

The present invention provides a technique advantageous in detecting the relative position between a first mark and a second mark provided on a first object and a second object, respectively, with high detection accuracy.

One of aspects of the present invention provides a detection device for detecting a relative position between a first mark provided on a first object and a second mark provided on a second object, which are arranged to be superimposed, comprising: an illumination system configured to illuminate the first mark and the second mark with first illumination light; a first detection system including a first image sensor and a first aperture stop and configured to form images of diffracted lights from the first mark and the second mark illuminated with the first illumination light by the illumination system on an imaging surface of the first image sensor via the first aperture stop; and a processor configured to obtain the relative position between the first mark and the second mark, wherein the first illumination light forms a first light intensity distribution asymmetric with respect to an optical axis of the illumination system on a pupil surface of the illumination system, or the first aperture stop is asymmetric with respect to an optical axis of the first detection system, and the processor obtains the relative position based on an output of the first image sensor and an index value having correlation with defocus amounts of the first mark and the second mark in the first detection system.

Further features of the present invention will become apparent from the following description of exemplary embodiments with reference to the attached drawings.

DESCRIPTION OF THE EMBODIMENTS

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

Figure 1:
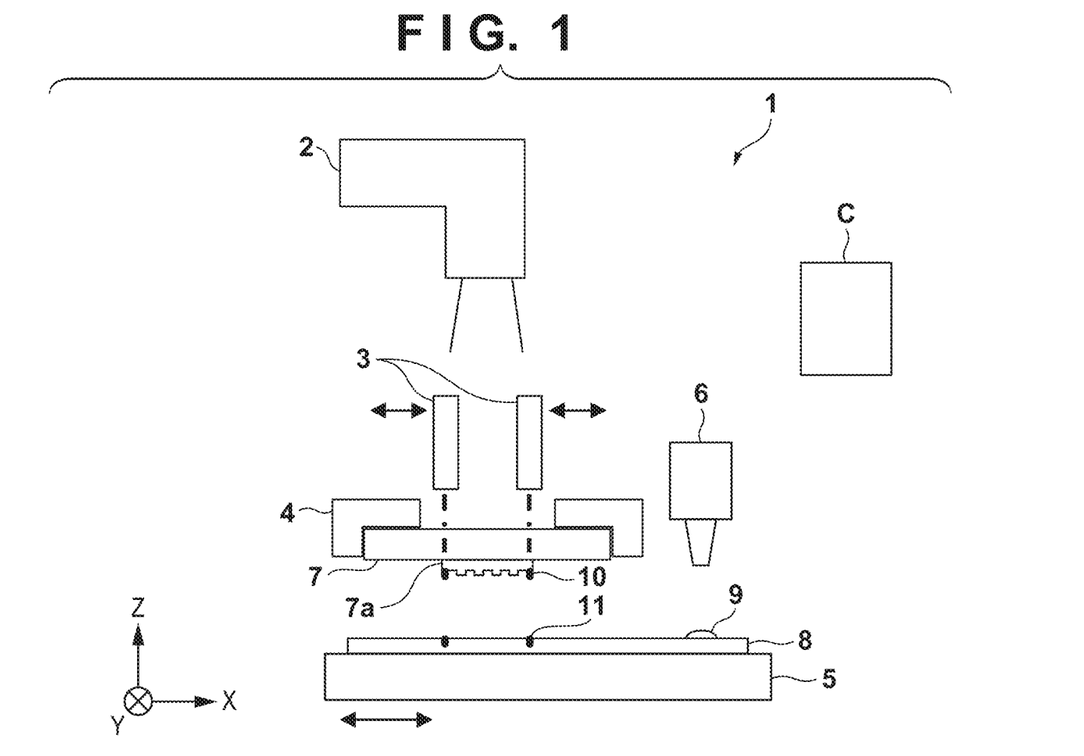
FIG. 1 is a view exemplifying the configuration of an imprint apparatus as an example of a lithography apparatus.

FIG. 1 shows the configuration of an imprint apparatus 1 as an example of a lithography apparatus that transfers a pattern of an original to a substrate. The imprint apparatus 1 is used to manufacture a device such as a semiconductor device, and forms a pattern made of a cured product of an imprint material 9 on a substrate 8 by molding the uncured imprint material 9 on the substrate 8 as a processing target object using a mold 7. A pattern forming process of forming a pattern on the substrate 8 by the imprint apparatus 1 can include a contact step, a filling and alignment step, a curing step, and a separation step. In the contact step, the imprint material 9 on a shot region of the substrate 8 and a pattern region 7a of the mold 7 are brought into contact with each other. In the filling and alignment step, a space defined by the substrate 8 and the pattern region 7a is filled with the imprint material 9, and the shot region of the substrate 8 and the pattern region 7a of the mold 7 are aligned. The shot region is a region where the pattern is formed by one pattern forming process. In other words, the shot region is a region where the pattern region 7a of the mold 7 is transferred by one pattern forming process.

As the imprint material, a curable composition (to be also referred to as a resin in an uncured state) to be cured by receiving curing energy is used. As the curing energy, an electromagnetic wave or heat can be used. The electromagnetic wave can be, for example, light selected from the wavelength range of 10 nm (inclusive) to 1 mm (inclusive), for example, infrared light, a visible light beam, or ultraviolet light. The curable composition can be a composition cured by light irradiation or heating. Among compositions, a photo-curable composition cured by light irradiation contains at least a polymerizable compound and a photopolymerization initiator, and may further contain a nonpolymerizable compound or a solvent, as needed. The nonpolymerizable compound is at least one material selected from the group consisting of a sensitizer, a hydrogen donor, an internal mold release agent, a surfactant, an antioxidant, and a polymer component. The imprint material can be arranged on the substrate in the form of droplets or in the form of an island or film formed by connecting a plurality of droplets. The imprint material may be supplied onto the substrate in the form of a film by a spin coater or a slit coater. The viscosity (the viscosity at 25° C.) of the imprint material can be, for example, 1 mPa·s (inclusive) to 100 mPa·s (inclusive). As the material of the substrate, for example, glass, a ceramic, a metal, a semiconductor (Si, GaN, SiC, or the like), a resin, or the like can be used. A member made of a material different from the substrate may be provided on the surface of the substrate, as needed. The substrate is, for example, a silicon wafer, a compound semiconductor wafer, or silica glass. An example of adopting a photo-curable composition as the imprint material will be described below but this is not intended to limit the type of the imprint material.

In the specification and the accompanying drawings, directions will be indicated on an XYZ coordinate system in which directions parallel to the surface of the substrate 8 are defined as the X-Y plane. Directions parallel to the X-axis, the Y-axis, and the Z-axis of the XYZ coordinate system are the X direction, the Y direction, and the Z direction, respectively. A rotation about the X-axis, a rotation about the Y-axis, and a rotation about the Z-axis are θX, θY, and θZ, respectively. Control or driving concerning the X-axis, the Y-axis, and the Z-axis means control or driving concerning a direction parallel to the X-axis, a direction parallel to the Y-axis, and a direction parallel to the Z-axis, respectively. In addition, control or driving concerning the ex-axis, the θY-axis, and the θZ-axis means control or driving concerning a rotation about an axis parallel to the X-axis, a rotation about an axis parallel to the Y-axis, and a rotation about an axis parallel to the Z-axis, respectively. In addition, a position is information that can be specified based on coordinates on the X-, Y-, and Z-axes, and an orientation is information that can be specified by values on the θX-, θY-, and θZ-axes. Positioning means controlling the position and/or orientation. Alignment (positioning) can include controlling the position and/or orientation of at least one of the substrate 8 and the mold 7 such that the alignment error (overlay error) between the shot region of the substrate 8 and the pattern region of the mold 7 decreases. In addition, alignment can include control to correct or change the shape of at least one of the shot region of the substrate 8 and the pattern region of the mold 7. The contact step and the separation step can be executed by driving the mold 7 by a mold driving mechanism 4, but may be executed by driving the substrate 8 by a substrate driving mechanism 5. Alternatively, the contact step and the separation step may be executed by driving the mold 7 by the mold driving mechanism 4 and driving the substrate 8 by the substrate driving mechanism 5.

The imprint apparatus 1 can include a curing unit 2, a detection device 3, the mold driving mechanism 4, the substrate driving mechanism 5, and a controller C. The imprint apparatus 1 may further include an application unit 6. After the contact step of bringing the mold 7 into contact with the imprint material 9 on the substrate 8, the curing unit 2 irradiates the imprint material 9 with light such as ultraviolet light as curing energy, thereby curing the imprint material 9. The curing unit 2 includes, for example, a light source, and a plurality of optical elements for uniformly irradiating the pattern region 7a of the mold 7 as an irradiated surface with light emitted from the light source in a predetermined shape. The irradiation region (irradiation range) with light by the curing unit 2 desirably has a surface area almost equal to the surface area of the pattern region 7a or slightly larger than the area of the pattern region 7a. This is to prevent, by making the irradiation region have a minimum necessary area, a situation in which the mold 7 or the substrate 8 expands due to heat generated by irradiation to cause a positional shift or distortion of the pattern transferred to the imprint material 9. In addition, this is to prevent a situation in which light reflected by the substrate 8 or the like reaches the application unit 6 to cure the imprint material 9 remaining in the discharge portion of the application unit 6, and an abnormality thus occurs in the operation of the application unit 6. As the light source, for example, a high-pressure mercury lamp, various kinds of excimer lamps, an excimer laser, or a light-emitting diode can be adopted. The light source can appropriately be selected in accordance with the characteristic of the imprint material 9 as a light receiving object.

The mold driving mechanism 4 can include a mold chuck (not shown) that holds the mold 7 by a vacuum suction force or an electrostatic force, and a mold driving unit (not shown) that drives the mold 7 by driving the mold chuck. The mold driving mechanism 4 can include the above-described correction mechanism. For example, the mold driving unit can be configured to drive the mold chuck or the mold 7 with respect to the Z-axis. The mold driving unit may be configured to further drive the mold chuck or the mold 7 with respect to at least one of the θX-axis, the θY-axis, the θZ-axis, the X-axis, and the Y-axis.

The substrate driving mechanism 5 can include a substrate chuck that holds the substrate 8 by a vacuum suction force or an electrostatic force, and a substrate driving unit (not shown) that drives the substrate 8 by driving the substrate chuck. For example, the substrate driving unit can be configured to drive the substrate chuck or the substrate 8 with respect to the X-axis, the Y-axis, and the θZ-axis. The substrate driving unit may be configured to further drive the substrate chuck or the substrate 8 with respect to at least one of the θX-axis, the θY-axis, and the Z-axis.

The application unit (dispenser) 6 applies or arranges the uncured imprint material 9 on the substrate 8. The application unit 6 may be arranged outside the housing of the imprint apparatus 1. In this case, the application unit 6 may be understood as a component that is not a component of the imprint apparatus 1.

The mold 7 includes, in the pattern region 7a, a pattern such as a circuit pattern to be transferred to the substrate 8 (the imprint material 9 thereon). The mold 7 can be made of a material that transmits light as curing energy, for example, quartz. The substrate 8 can be, for example, a semiconductor substrate such as a single-crystal silicon substrate or a substrate including at least one layer on a semiconductor substrate.

The controller C can be configured to control the curing unit 2, the detection device 3, the mold driving mechanism 4, the substrate driving mechanism 5, and the application unit 6. The controller C can be formed by, for example, a Field Programmable Gate Array (FPGA), a computer embedded with a program, or a combination of all or some of these components. The FPGA can include a Programmable Logic Device (PLD) or an Application Specific Integrated Circuit (ASIC). In an example, the controller C includes a memory and a processor, and can define the operation and function of the imprint apparatus 1 by operating based on arithmetic formulas, parameters, and computer programs stored (saved) in the memory.

An imprint process or pattern forming process executed by the imprint apparatus 1 will now be described. First, the substrate 8 is conveyed to the substrate chuck of the substrate driving mechanism 5 by a substrate conveyance mechanism (not shown), and fixed to the substrate chuck. Subsequently, the substrate 8 is driven by the substrate driving mechanism 5 so that the shot region of the substrate 8 moves to an application position by the application unit 6. After that, the application unit 6 applies, arranges, or supplies the imprint material 9 onto the shot region (imprint region) of the substrate (application step).

Next, the substrate 8 is driven by the substrate driving mechanism 5 so that the shot region where the imprint material 9 has been arranged is arranged at a position immediately below the pattern region 7a of the mold 7. Then, for example, the mold driving mechanism 4 lowers the mold 7 to bring the imprint material 9 on the substrate 8 and the pattern region 7a of the mold 7 into contact with each other (contact step). This fills the space (including a concave portion of the pattern region 7a) between the substrate 8 and the pattern region 7a of the mold 7 with the imprint material 9 (filling step). Furthermore, with respect to a plurality of mark pairs each formed by a mold mark 10 and a substrate mark 11, the detection device 3 is used to detect or measure the relative position between the mold mark 10 and the substrate mark 11. Based on the result, the pattern region 7a and the shot region of the substrate 8 are aligned (alignment step). At this time, the correction mechanism may be used to correct the shape of the pattern region 7a of the mold 7. In addition, a heating mechanism (not shown) may be used to correct the shape of the shot region of the substrate 8.

Upon completion of the filling and alignment steps, the curing unit 2 irradiates the imprint material 9 with light via the mold 7, thereby curing the imprint material 9 (curing step). At this time, the detection device 3 can be driven to retreat so as not to block the optical path of the curing unit 2. Subsequently, the mold driving mechanism 4 raises the mold 7 to separate the mold 7 from the cured imprint material 9 on the substrate 8 (separation step).

The imprint apparatus 1 can be understood as an example of a lithography apparatus that includes the detection device 3, aligns the original (or the pattern region) and the substrate (or the shot region) based on an output from the detection device 3, and transfers the pattern of the original to the substrate. The imprint apparatus 1 aligns the mold 7 (first object) provided with the mold mark 10 and the substrate 8 (second object) provided with the substrate mark 11 based on an output from the detection device 3.

Figure 4:
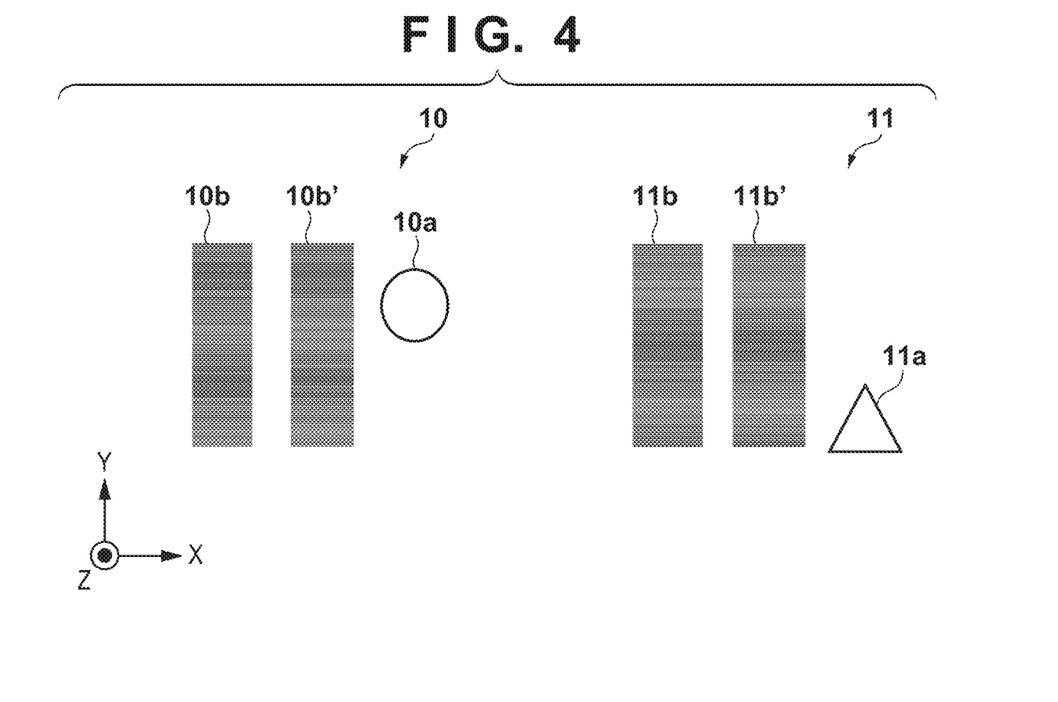
FIG. 4 is a view exemplifying a mold mark and a substrate mark.

FIG. 4 schematically shows the mold mark 10 and the substrate mark 11, which are alignment marks. The mold mark 10 can include, for example, two first marks 10b and 10b' and a third mark 10a. The mold mark 10 need only include at least one first mark 10b (or 10b') and one third mark 10a. The first marks 10b and 10b' are diffraction gratings. The substrate mark 11 can include, for example, two second marks 11b and 11b' and a fourth mark 11a. The substrate mark 11 need only include at least one second mark 11b (or 11b') and one fourth mark 11a. The first marks 10b and 10b' and the second marks 11b and 11b' are fine detection marks, and the third mark 10a and the fourth mark 11a are coarse detection marks. The first mark 10b and the second mark 11b can be arranged to be superimposed on each other and form a moiré fringe. The first mark 10b' and the second mark 11b' can be arranged to overlap each other and form a moiré fringe.

The first marks 10b and 10b' and the second marks 11b and 11b' can each have a periodical pattern. With respect to the geometrical center position between the third mark 10a and the fourth mark 11a as a reference, the relative position between the mold 7 (mold mark 10) and the substrate 8 (substrate mark 11) can be obtained from a result of a detection by the detection device 3. The light amount of the moiré fringe changes in accordance with the diffraction efficiency of the first mark 10b (10b') and the second mark 11b (11b'). In particular, since the diffraction efficiency periodically changes in accordance with a wavelength change, there can exist a wavelength with which the moiré fringe can efficiently be detected and a wavelength with which detection of the moiré fringe is difficult. Light having the wavelength with which detection of the moiré fringe is difficult can be noise.

Detection of the relative position between the first mark 10b and the second mark 11b using the moiré fringe formed by diffracted lights from the first mark 10b (10b') and the second mark 11b (11b') each formed by a diffraction grating will be described with reference to FIGS. 5A to 5D. The period in the measurement direction of the pattern (grating) of the first mark 10b provided on the mold 7 and that of the second mark 11b provided on the substrate 8 are slightly different. If two diffraction gratings whose periods are different from each other are superimposed on each other, a pattern having a period reflecting the difference in period between the diffraction gratings, that is, a so-called moiré fringe (moiré) appears due to interference between diffracted lights from the two diffraction gratings. At this time, since the phase of the moiré fringe changes in accordance with the relative position between the diffraction gratings, it is possible to obtain the relative position between the first mark 10b and the second mark 11b, that is, the relative position between the mold 7 and the substrate 8 by detecting the moiré fringe.

Figure 5A:
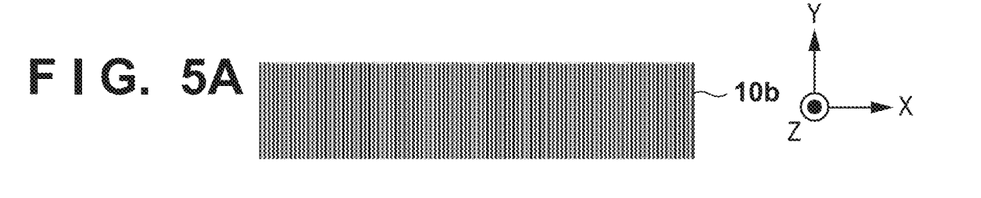
FIGS. 5A to 5D are view for exemplarily explaining a moiré fringe.
Figure 5B:
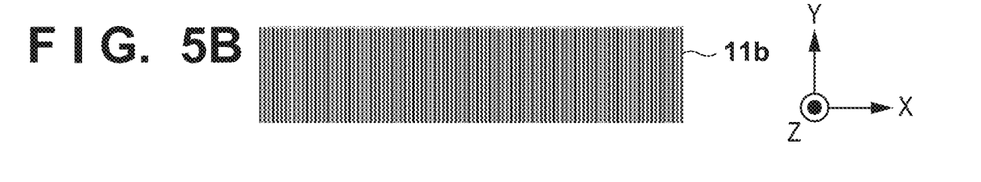
Figure 5C:
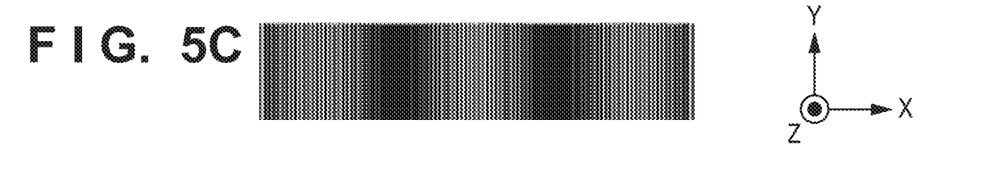
Figure 5D:
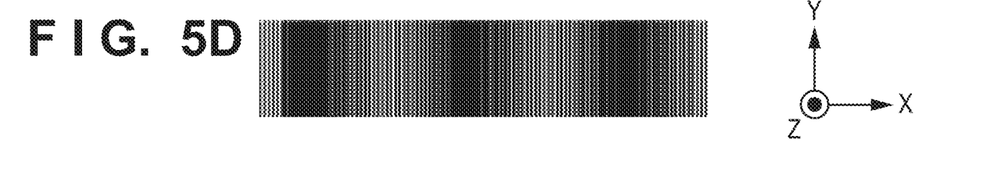
Figure 6:
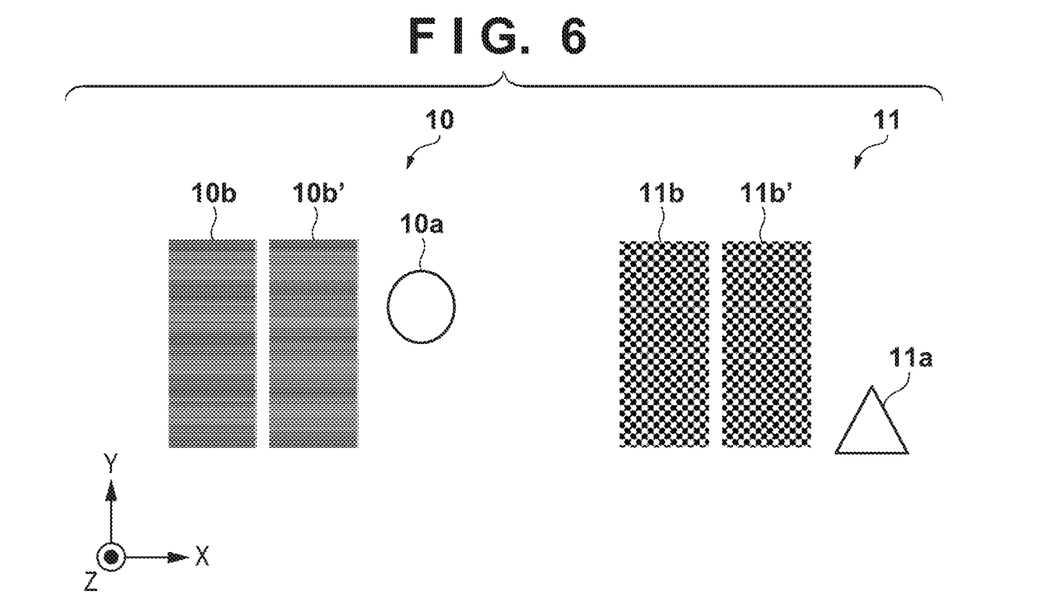
FIG. 6 is a view exemplifying a mold mark and a substrate mark.

More specifically, if the first mark 10b and the second mark 11b having the slightly different periods are superimposed on each other, the diffracted lights from the first mark 10b and the second mark 11b overlap each other, thereby generating a moiré fringe having a period reflecting the difference in period, as shown in FIG. 5C. In the moiré fringe, the positions of bright and dark portions (the phase of the fringe) change in accordance with the relative position between the first mark 10b and the second mark 11b. If, for example, one diffraction grating of the first mark 10b and the second mark 11b is shifted in the X direction, the moiré fringe shown in FIG. 5C changes to a moiré fringe shown in FIG. 5D. Since the moiré fringe is generated as a fringe having a large period by enlarging the actual positional shift amount between the first mark 10b and the second mark 11b, even if the resolution of the detection device 3 is low, it is possible to detect the relative position between the first mark 10b and the second mark 11b with high accuracy. The first mark 10b and the second mark 11b have been described as one-dimensional diffraction grating patterns. For example, each of the second marks 11b and 11b' can have a checkerboard pattern as shown in FIG. 6. If the diffraction grating pattern is a checkerboard pattern, light can be diffracted not only in the Y direction but also in the X direction shown in FIG. 4.

A method of determining a relative position by moiré fringe detection will be described. The first mark 10b and the second mark 11b are each formed by a periodic pattern, and have slightly different periods in the measurement direction. Thus, if these are superimposed on each other, a moiré fringe whose light intensity changes in the Y direction is formed. Because of the difference in period between the first mark 10b and the second mark 11b, the shift direction of the moiré fringe when the relative position changes is different. For example, in a case where the period of the first mark 10b is slightly larger than the period of the second mark 11b, if the substrate 8 relatively shifts in the +Y direction, the moiré fringe also shifts in the +Y direction. On the other hand, in a case where the period of the first mark 10b is slightly smaller than the period of the second mark 11b, if the substrate 8 relatively shifts in the +Y direction, the moiré fringe shifts in the −Y direction.

The first mark 10b' and the second mark 11b' form another moiré fringe. The magnitude relationship between the periods of the first mark 10b and the second mark 11b is reversed with respect to the magnitude relationship between the periods of the first mark 10b' and the second mark 11b'. Therefore, if the relative position changes, the positions of the two measured moiré fringes change in the opposite directions. If the periodic marks on the mold side and the substrate side, that generate moiré fringes, are shifted by one period, it is impossible to detect the shift for one period in the moiré fringe detection principle. Therefore, by using the third mark 10a and the fourth mark 11a with low detection accuracy, it can be confirmed that there is no relative positional shift for one period between the mold 7 and the substrate 8.

Figure 2:
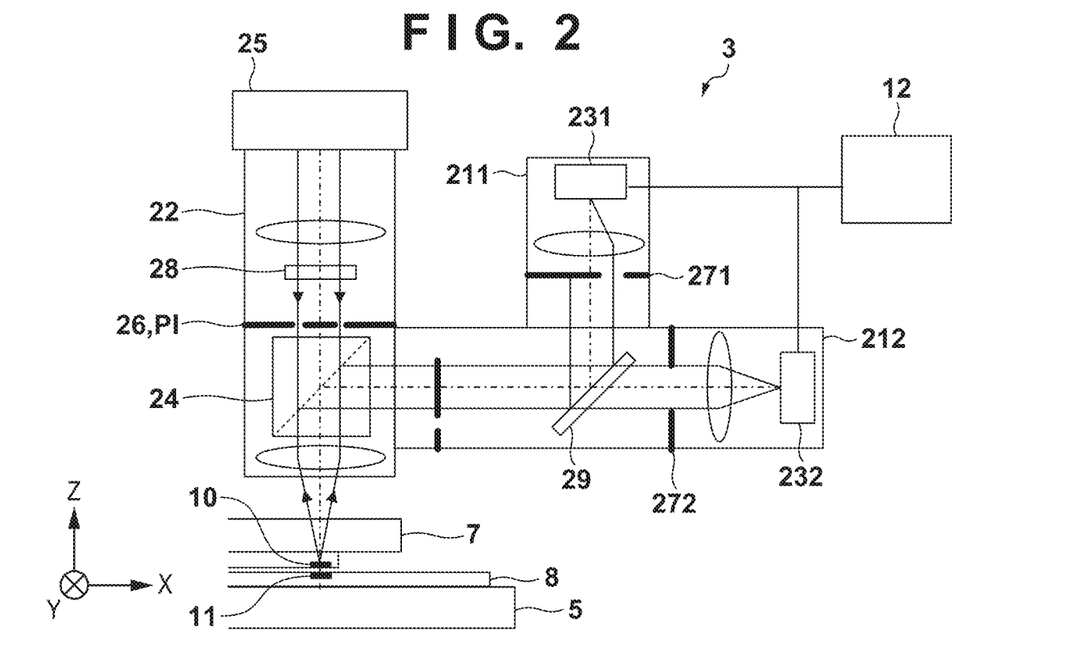
FIG. 2 is a view exemplifying the configuration of a detection device.

FIG. 2 shows an example of the configuration of the detection device 3. The detection device 3 can be configured to detected the relative position between the mold mark 10 (first mark) and the substrate mark 11 (second mark) provided on the mold 7 (first object) and the substrate 8 (second object) which are arranged to be superimposed on each other. The detection device 3 can include an illumination system 22, a first detection system 211, a second detection system 212, and a processor 12. All or some of the functions of the processor 12 may be incorporated in the controller C. That is, all or some of the functions of the processor 12 may be executed by the controller C. The processor 12 can be formed by, for example, a Field Programmable Gate Array (FPGA), a computer embedded with a program, or a combination of all or some of these components.

The illumination system 22 can be configured to illuminate the first mark 10b (10b') and the second mark 11b (11b') with first illumination light. The illumination system 22 can also be configured to illuminate the third mark 10a and the fourth mark 11a with second illumination light. The first illumination light forms a first light intensity distribution on a pupil surface PI of the illumination system 22, as exemplified in FIG. 3A. The first light intensity distribution can be a light intensity distribution asymmetric with respect to the optical axis of the illumination system 22. The second illumination light forms a second light intensity distribution on the pupil surface PI of the illumination system 22, as exemplified in FIG. 3B. The asymmetry of the second light intensity distribution with respect to the optical axis of the illumination system 22 can be different from the asymmetry of the first light intensity distribution with respect to the optical axis of the illumination system 22. Here, the term "asymmetry" may be replaced with a term "symmetry". That is, the symmetry of the second light intensity distribution with respect to the optical axis of the illumination system 22 can be different from the symmetry of the first light intensity distribution with respect to the optical axis of the illumination system 22. Preferably, the second light intensity distribution is symmetric with respect to the optical axis of the illumination system 22.

The first detection system 211 can include a first image sensor 231 and a first aperture stop 271. The first detection system 211 can form images of diffracted lights from the first mark 10b (10b') and the second mark 11b (11b') illuminated with the first illumination light by the illumination system 22 on the imaging surface of the first image sensor 231 via the first aperture stop 271. The first aperture stop 271 is arranged on the pupil surface of the first detection system 211. The first aperture stop 271 is asymmetric with respect to the optical axis of the first detection system 211. That is, the first aperture stop 271 has an opening asymmetric with respect to the optical axis of the first detection system 211. The second detection system 212 can include a second image sensor 232 and a second aperture stop 272. The second detection system 212 can form images of lights from the third mark 10a and the fourth mark 11a illuminated with the second illumination light by the illumination system 22 on the imaging surface of the second image sensor 232 via the second aperture stop 272. The second aperture stop 272 is arranged on the pupil surface of the second detection system 212. The second aperture stop 272 is symmetric with respect to the optical axis of the second detection system 212. That is, the second aperture stop 272 has an opening symmetric with respect to the optical axis of the second detection system 212. A part of the first detection system 211 and a part of the second detection system 212 are shared each other, and a half mirror 29 is provided for this.

The processor 12 obtains the relative position between the first mark 10b and the second mark 11b. More specifically, the processor 12 obtains the relative position between the first mark 10b and the second mark 11b based on the output of the first image sensor 231 and an index value having correlation with the defocus amount of the first mark 10b and the second mark 11b in the first detection system 211. In addition, the processor 12 obtains the relative position between the third mark 10a and the fourth mark 11a.

The illumination system 22 will be described below in detail. The illumination system 22 can include, for example, a light source 25, an illumination stop 26 arranged on the pupil surface PI, and a prism 24. A part of the illumination system 22 is shared by the first detection system 211 and the second detection system 212, and the prism 24 is provided for this. The illumination stop 26 shields unnecessary light such that the unnecessary light does not enter the marks 10 and 11.

Figure 3A:
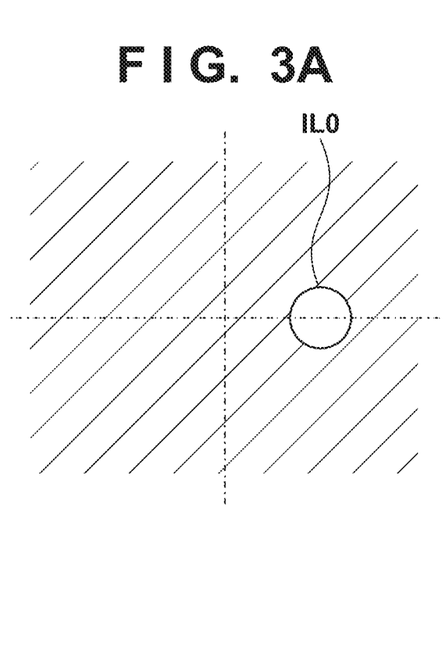
FIG. 3A is a view exemplifying a first light intensity distribution formed on the pupil surface of an illumination system by first illumination light.

As exemplified in FIG. 3A, the first illumination light that illuminates the first mark 10b (10b') and the second mark 11b (11b'), which form a moiré fringe, can form, on the pupil surface PI of the illumination system 22, the first light intensity distribution asymmetric with respect to the optical axis of the illumination system 22. As exemplified in FIG. 3A, the first light intensity distribution has a single pole IL0, and illumination by such a light intensity distribution is called a monopole illumination. The moiré fringe formed by the first mark 10b (10b') and the second mark 11b (11b') is detected by the first detection system 211 (first image sensor 231) via the first aperture stop 271 that is asymmetric with respect to the optical axis of the first detection system 211. This configuration is advantageous in preventing specular reflected lights from the first mark 10*b* (10*b'*) and the second mark 11*b* (11*b'*) from entering the first image sensor 231 and changing to a noise component. This improves the detection accuracy of the relative position between the mold mark 10 and the substrate mark 11 (the relative position between the first mark 10*b* (10*b'*) and the second mark 11*b* (11*b'*)). Note that only one of the asymmetric first light intensity distribution and the asymmetric first aperture stop 271 may be provided.

Figure 3B:
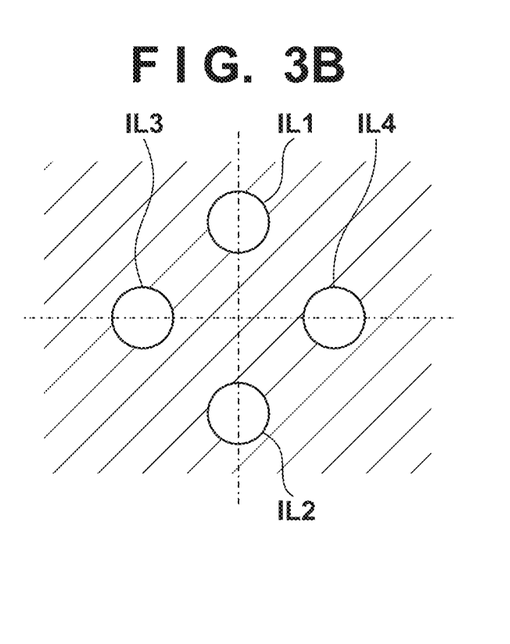
FIG. 3B is a view exemplifying a second light intensity distribution formed on the pupil surface of the illumination system by second illumination light.

On the other hand, as exemplified in FIG. 3B, the second illumination light that illuminates the mold mark 10*a* and the fourth mark 11*a*, which are coarse detection marks, can form, on the pupil surface PI of the illumination system 22, the second light intensity distribution symmetric with respect to the optical axis of the illumination system 22. As exemplified in FIG. 3B, the second light intensity distribution can have a plurality of poles IL1 to IL4 (for example, quadrupole). The images of the third mark 10*a* and the fourth mark 11*a* are detected by the second detection system 212 (second image sensor 232) via the second aperture stop 272 that is symmetric with respect to the optical axis of the second detection system 212. This configuration is advantageous in reducing a detection error of the relative position between the third mark 10*a* and the fourth mark 11*a* in a state in which the mold mark 10 and the substrate mark 11 are defocused from the second detection system 212 (and the first detection system 211). Note that only one of the symmetric second light intensity distribution and the symmetric second aperture stop 272 may be provided.

To change the illumination method (the light intensity distribution on the pupil surface PI of the illumination system 22) between the first illumination light that illuminates the first mark 10*b* and the second mark 11*b* and the second illumination light that illuminates the third mark 10*a* and the fourth mark 11*a*, the illumination system 22 can include a diffraction optical element 28. The diffraction optical element 28 can be arranged on a surface conjugate with respect to the surface between the mold 7 (mold mark 10) and the substrate 8 (substrate mark 11). The diffraction optical element 28 can include a first region and a second region, which do not overlap. The first illumination light is light that passes through the first region, and the second illumination light is light that passes through the second region. The first region is projected onto the first mark 10*b* and the second mark 11*b*. More specifically, the first illumination light that is diffracted light diffracted by the first region of the diffraction optical element 28 forms the first light intensity distribution as exemplified in FIG. 3A on the pupil surface PI and illuminates the first mark 10*b* and the second mark 11*b*. Also, the second illumination light that is diffracted light diffracted by the second region of the diffraction optical element 28 forms the second light intensity distribution as exemplified in FIG. 3B on the pupil surface PI and illuminates the third mark 10*a* and the fourth mark 11*a*. Hence, the first mark 10*b* and the second mark 11*b*, and the third mark 10*a* and the fourth mark 11*a* are illuminated simultaneously.

The light source 25 can include, for example, at least one of a halogen lamp, an LED, a semiconductor laser (LD), a high-pressure mercury lamp, a metal halide lamp, a super-continuum light source, and a Laser-Driven Light Source (LDLS). The wavelength of illumination light generated by the light source 25 is selected not to cure the imprint material.

Figure 7:
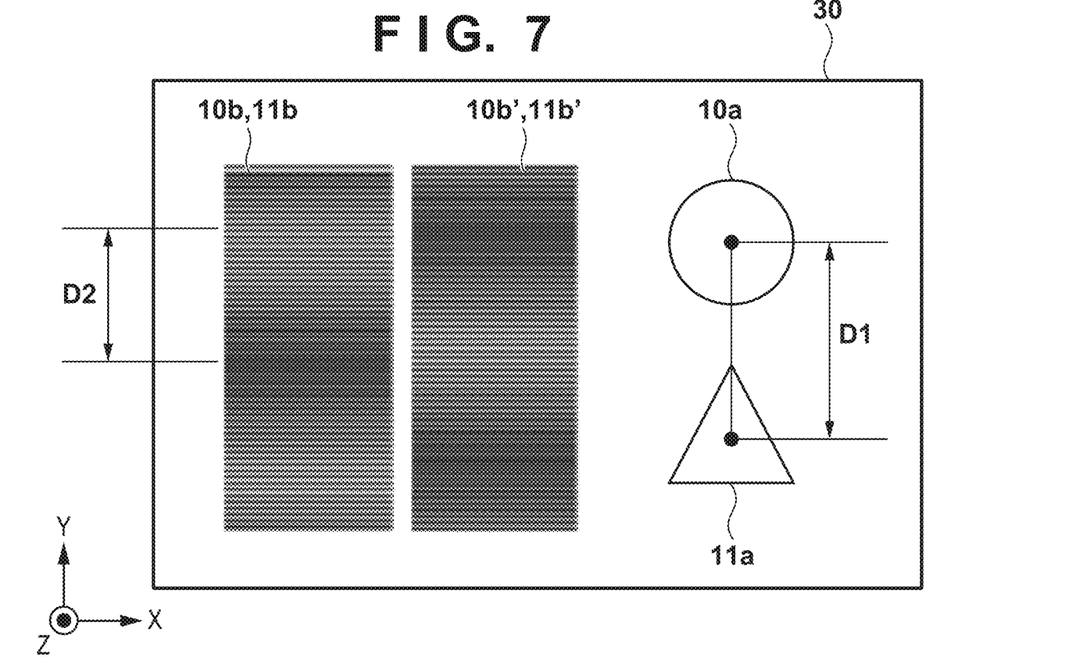
FIG. 7 is a view exemplifying the field of view of a first detection system and a second detection system.

FIG. 7 exemplifies a field 30 of view of the first detection system 211 and the second detection system 212. The first detection system 211 need only detect the moiré fringe formed by the first mark 10*b* (10*b'*) and the second mark 11*b* (11*b'*), and the second detection system 212 need only detect the relative distance between the third mark 10*a* and the fourth mark 11*a*.

The processor 12 can detect a relative distance D1 between the third mark 10*a* and the fourth mark 11*a* based on the output (image) from the second image sensor 232 of the second detection system 212. In addition, the processor 12 can calculate the difference between the detected relative distance D1 and the designed relative distance between the third mark 10*a* and the fourth mark 11*a*. This difference is the positional shift between the third mark 10*a* (mold mark 10) and the fourth mark 11*a* (substrate mark 11). The first image sensor 231 of the first detection system 211 outputs the image of the moiré fringe formed by the first mark 10*b* (10*b'*) and the second mark 11*b* (11*b'*). The processor 12 can calculate relative position information D2 representing the relative position (relative positional shift) between the first mark 10*b* (10*b'*) and the second mark 11*b* (11*b'*) based on the output (image) from the first image sensor 231.

Here, the relative distance D1 detected based on the images of the third mark 10*a* and the fourth mark 11*a* illuminated with the second illumination light is insensitive to defocus. On the other hand, the relative position information D2 between the first mark 10*b* (10*b'*) and the second mark 11*b* (11*b'*) illuminated with the first illumination light is sensitive to defocus. The first mark 10*b* (10*b'*) and the second mark 11*b* (11*b'*) are fine detection marks used to finely detect the relative position between the mold mark 10 and the substrate mark 11. Hence, the relative position information D2 between the first mark 10*b* (10*b'*) and the second mark 11*b* (11*b'*) detected in the defocus state should be corrected by some method.

In this embodiment, using the existence of correlation between the defocus amount and the relative position between the first mark 10*b* (10*b'*) and the second mark 11*b* (11*b'*), the relative position information D2 detected using the first detection system 211 is corrected to a more correct relative position. Thus, the relative position between the first mark 10*b* (10*b'*) and the second mark 11*b* (11*b'*) can be detected with high accuracy. Here, the defocus amount is the shift amount of the surface between the mold 7 (mold mark 10) and the substrate 8 (substrate mark 11) with respect to the object surface in a direction vertical to the object surface of the first detection system 211. Alternatively, the defocus amount is the shift amount of the mold mark 10 or the substrate mark 11 with respect to the object surface in the direction vertical to the object surface of the first detection system 211. Note that if the first detection system 211 has a focusing function, the object surface is variable.

Figure 8:
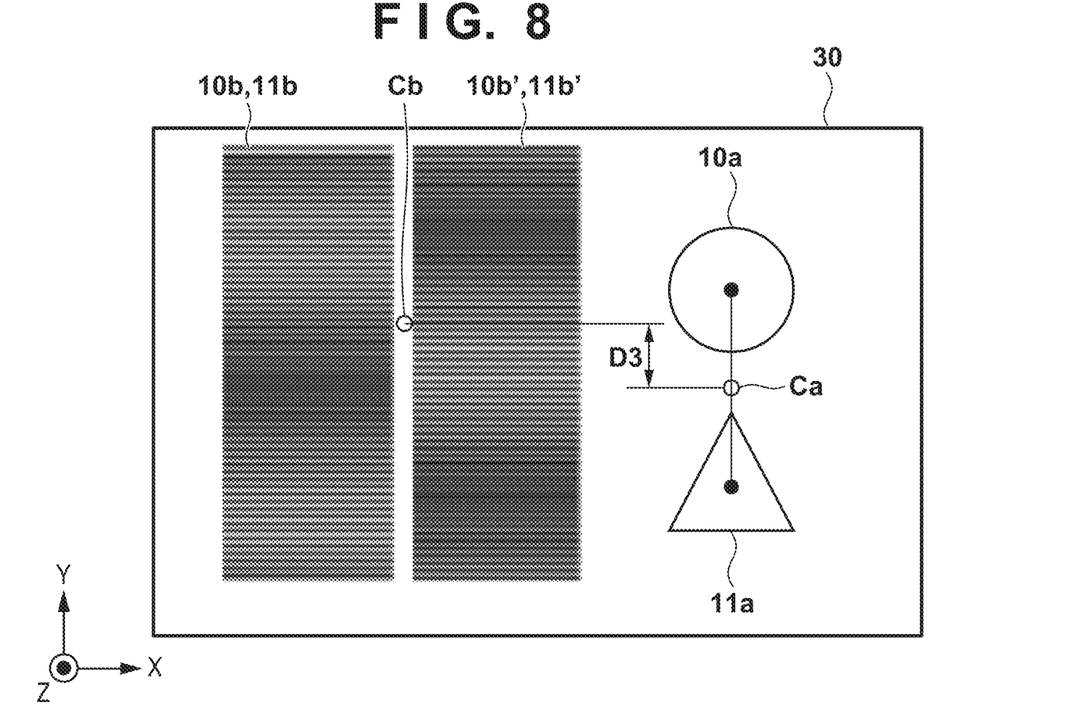
FIG. 8 is a view exemplifying a mark relative distance D3 in the field of view of the first detection system and the second detection system.

The principle for detecting a corrected relative position (that is, a correct relative position) by correcting, in accordance with a defocus amount, the relative position information D2 detected using the first detection system 211 will be described first. FIG. 8 exemplifies the field 30 of view of the first detection system 211 and the second detection system 212. Note that as described above, the first detection system 211 need only detect the moiré fringe formed by the first mark 10*b* (10*b'*) and the second mark 11*b* (11*b'*), and the second detection system 212 need only detect the relative distance between the third mark 10*a* and the fourth mark 11*a*.

As described above, the relative distance D1 detected based on the images of the third mark 10*a* and the fourth mark 11*a* illuminated with the second illumination light is insensitive to defocus. Hence, a center (to be referred to as the center of gravity of the image of the third mark 10*a* and the image of the fourth mark 11a hereinafter) Ca of a line segment connecting the center of the image of the third mark 10a and the center of the image of the fourth mark 11a can be considered as constant irrespective of the defocus amount. On the other hand, as described above, the relative position information D2 between the first mark 10b (10b') and the second mark 11b (11b') illuminated with the first illumination light is sensitive to defocus. Hence, a center (to be referred to as the center of gravity of the moiré fringe hereinafter) Cb of the image of the moiré fringe formed by the first mark 10b (10b') and the second mark 11b (11b') depends on the defocus amount. A mark relative distance D3 is defined as D3=Cb−Ca. The mark relative distance D3 can be understood as an index value having correlation with the defocus amount. The mark relative distance D3 can also be understood as equivalent to the defocus amount. In an evaluation method, the defocus amount is a shift amount (shift amount in the Z direction) from the designed object surface of the first detection system 211, and the mark relative distance D3 and the defocus amount can be expressed by $$\text{mark relative distance } D3 = \text{defocus amount} \times \tan\theta \quad (1)$$

Figure 9A:
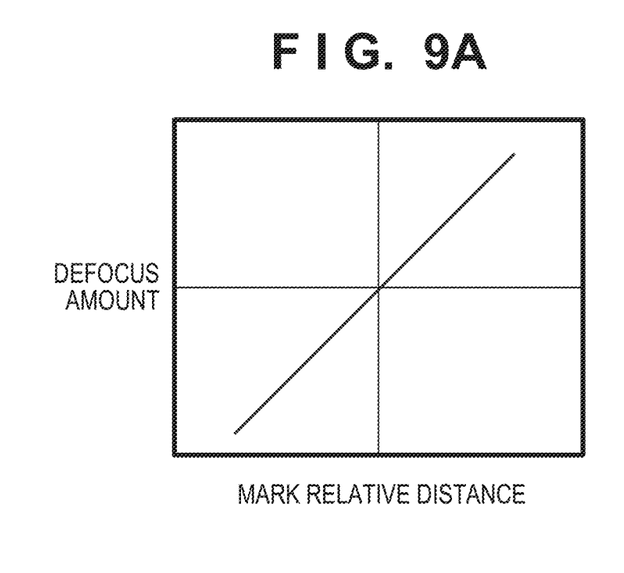
FIG. 9A is a view exemplifying the relationship between the mark relative distance D3 and a defocus amount.

Here, θ is the radiation angle of light that is diffracted by the first mark 10b (10b') and the second mark 11b (11b') and enters the first image sensor 231 via the opening of the first aperture stop 271. θ is uniquely determined by the configuration of the first mark 10b (10b') and the second mark 11b (11b'), the wavelength of the first illumination light, and the opening of the first aperture stop 271. If the first illumination light has a light intensity distribution on a mark surface (a surface on which a mark is arranged), for example, the center-of-gravity position of the light intensity distribution passing through the first aperture stop 271 is converted into the radiation angle. The mark relative distance D3 can be converted into the defocus amount using equation (1). Note that it can be seen that the mark relative distance D3 and the defocus amount have a linear relationship in equation (1). FIG. 9A shows the relationship between the mark relative distance D3 and the defocus amount according to equation (1). The information (first information) exemplified in FIG. 9A can be stored in the processor 12 or the like as information used to determine, from the mark relative distance D3 having correlation with a defocus amount, the defocus amount in accordance with the correlation.

Figure 9B:
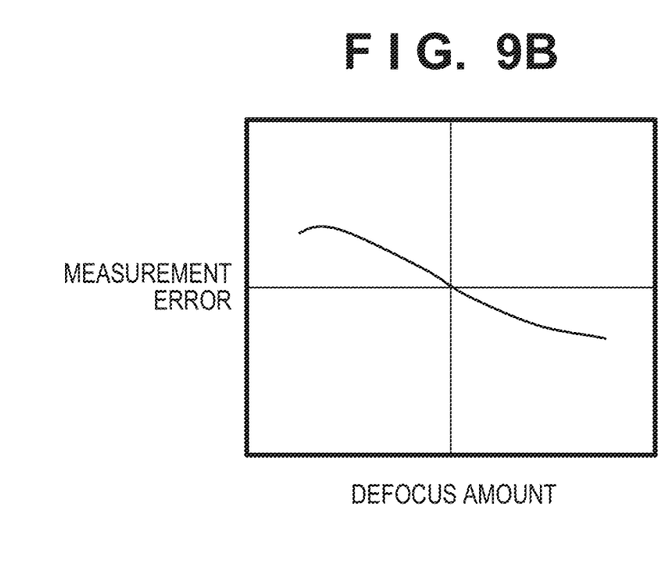
FIG. 9B is a view exemplifying the relationship between a defocus amount and a measurement error (correction value)

Next, the relationship between the defocus amount and a measurement error in the relative position information detected using the first detection system 211 at the time of defocus will be examined. The measurement error at the time of defocus depends on the defocus amount. It is therefore necessary to acquire the relationship between the defocus amount and the relative position information in advance. As the method, for example, an operation of positioning the substrate 8 concerning the Z direction by the substrate driving mechanism 5 such that a known defocus amount is generated and acquiring relative position information using the first detection system 211 of the detection device 3 is executed for a plurality of defocus amounts. In a state in which the detection device 3 is calibrated, if the given defocus amount is 0, the measurement error is 0. Pieces of relative position information obtained for the plurality of defocus amounts are approximated by a curve, thereby obtaining information (correction table) representing the relationship between the defocus amount and the measurement error. FIG. 9B exemplifies the relationship (correction table) between the defocus amount and the measurement error. When the relative position information D2 detected using the first detection system 211 is corrected using the measurement error, a correct relative position can be obtained. For this reason, the measurement error may be understood as a correction value. The information (second information) exemplified in FIG. 9B can be stored in the processor 12 or the like as information used to determine a measurement error (correction value) corresponding to a defocus amount.

In summary, the processor 12 can determine the correction value corresponding to the mark relative distance D3 (index value) using the first information representing the relationship between the index value and the defocus amount and the second information representing the relationship between the defocus amount and the measurement error (correction value). More specifically, the processor 12 can determine the defocus amount corresponding to the mark relative distance D3 (index value) using the first information representing the relationship between the index value and the defocus amount. In addition, the processor 12 can determine the correction value corresponding to the determined defocus amount using the second information representing the relationship between the defocus amount and the correction value. Furthermore, the processor 12 can determine a corrected relative position (relative positional shift) by correcting the relative position information D2 using the correction value.

In the above-described major example, the first mark and the second mark, which are fine detection marks, are illuminated with the first light intensity distribution asymmetric with respect to the optical axis, and the third mark and the fourth mark, which are coarse detection marks, are illuminated with the second light intensity distribution symmetric with respect to the optical axis. However, if the asymmetry of the second light intensity distribution with respect to the optical axis is different from the asymmetry of the first light intensity distribution with respect to the optical axis, the defocus amount and the measurement error (correction value) corresponding to it can be determined using this.

Also, in the above-described major example, the first aperture stop 271 asymmetric with respect to the optical axis is provided in the first detection system 211, and the second aperture stop 272 symmetric with respect to the optical axis is provided in the second detection system 212. However, if the asymmetry of the second aperture stop 272 with respect to the optical axis is different from the asymmetry of the first aperture stop 271 with respect to the optical axis, the defocus amount and the measurement error (correction value) corresponding to it can be determined using this.

Also, the defocus amount may be detected using another method, for example, a height sensor that measures the height of the surface of the substrate 8.

Figure 10:
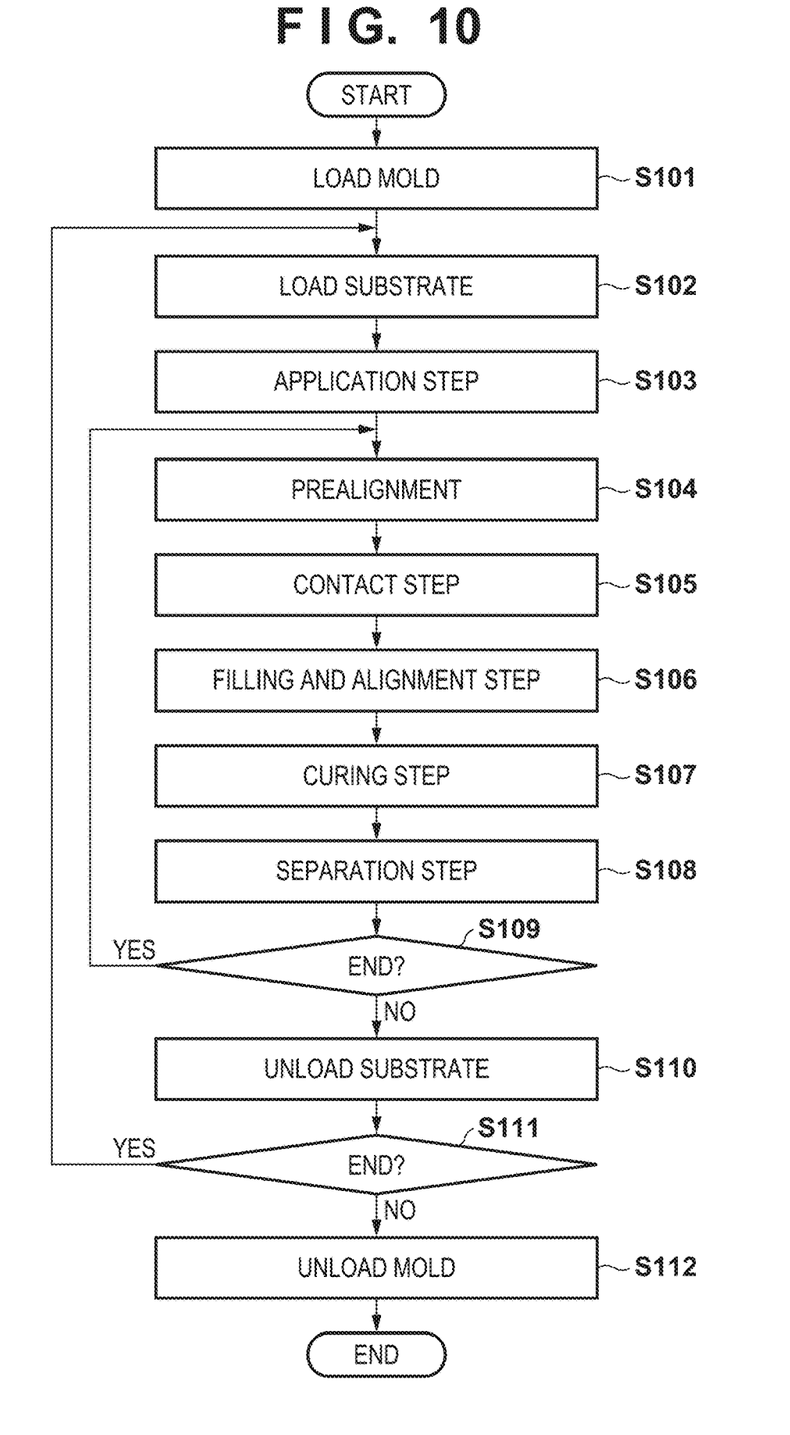
FIG. 10 is a flowchart exemplifying the operation of the imprint apparatus in a manufacturing mode.

FIG. 10 exemplarily shows the operation of the imprint apparatus 1 in a manufacturing mode. This operation is controlled by the controller C. In step S101, the mold 7 is loaded and held by the mold holding unit of the mold driving mechanism 4. In step S102, the substrate 8 is loaded and held by the substrate holding unit of the substrate driving mechanism 5. In step S103, the application unit 6 can arrange the imprint material 9 on a process target shot region of the substrate 8. Note that the imprint material 9 may continuously be applied to a plurality of shot regions. If the arrangement of the imprint material 9 on the process target shot region is already completed, step S103 is skipped.

In step S104, the substrate 8 is prealigned by the substrate driving mechanism 5 such that the process target shot region is arranged under the mold 7. In step S105, the imprint material 9 on the shot region and the pattern region 7a of the mold 7 are brought into contact with each other. In step S106, the filling and alignment step is executed. In the alignment step executed concurrently with the filling step, the process target shot region and the mold 7 are aligned using the detection device 3. At this time, the relative position information between the first mark and the second mark detected based on the output of the first detection system 211 is corrected by the correction value corresponding to the defocus amount. Thus, the corrected relative position is determined, and alignment is performed based on this. The process for determining the relative position may be performed by the processor 12, and all or some of the processes may be performed by the controller C.

In step S107, the curing unit 2 irradiates the imprint material 9 with curing energy via the mold 7 to cure the imprint material 9, and a pattern made of a cured product of the imprint material 9 is formed on the shot region. In step S108, the mold 7 is separated from the pattern made of the cured product of the imprint material 9.

Steps S103 to S108 are executed for all shot regions of the substrate 8, and after that, the substrate 8 is unloaded. If a following substrate 8 exists, steps S102 to S110 are executed for the substrate 8, and after that, the mold 7 is unloaded.

Figure 11:
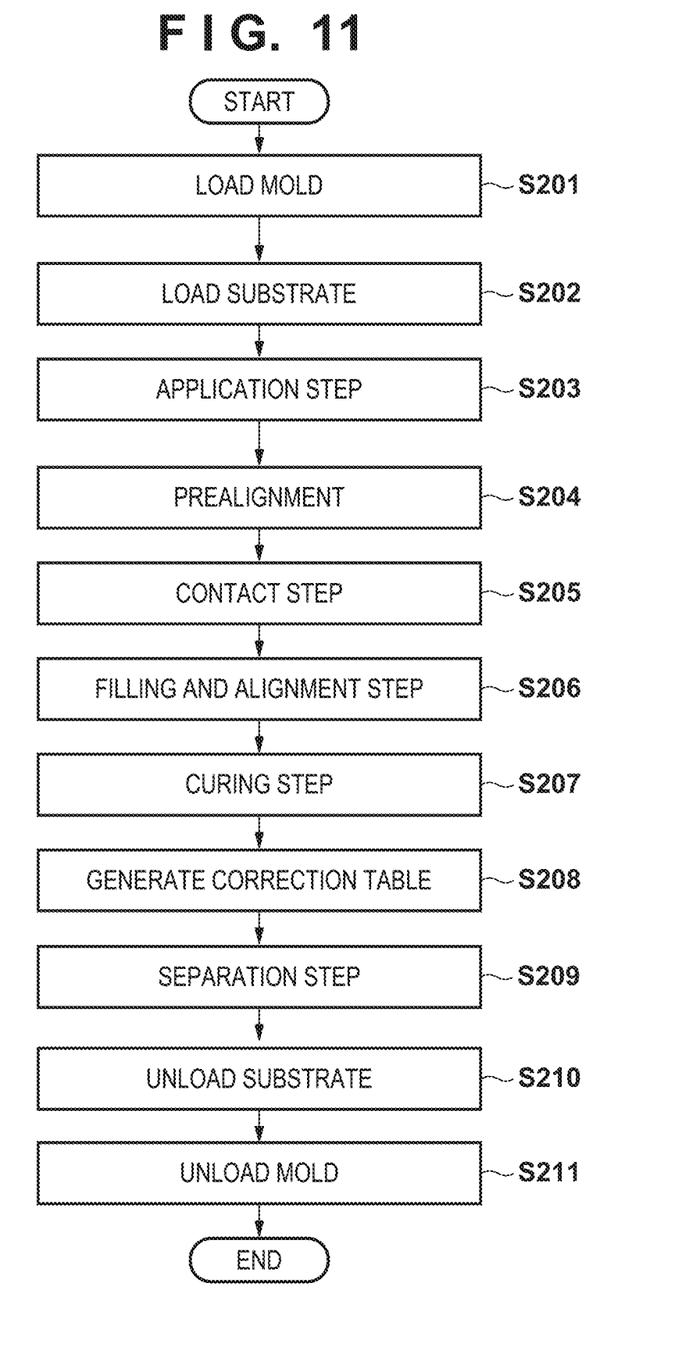
FIG. 11 is a flowchart exemplifying the operation of the imprint apparatus in a calibration mode.

FIG. 11 exemplarily shows the operation of the imprint apparatus 1 in a calibration mode. This operation is controlled by the controller C. In step S201, the mold 7 is loaded and held by the mold holding unit of the mold driving mechanism 4. In step S202, the substrate 8 is loaded and held by the substrate holding unit of the substrate driving mechanism 5. In step S203, the application unit 6 can arrange the imprint material 9 on a shot region of the substrate 8.

In step S204, the substrate 8 is prealigned by the substrate driving mechanism 5 such that the shot region is arranged under the mold 7. In step S205, the imprint material 9 on the shot region and the pattern region 7a of the mold 7 are brought into contact with each other. In step S206, the filling and alignment step is executed. In the alignment step executed concurrently with the filling step, the shot region and the mold 7 are aligned using the detection device 3. In step S207, the curing unit 2 irradiates the imprint material 9 with curing energy via the mold 7 to cure the imprint material 9, and a pattern made of a cured product of the imprint material 9 is formed on the shot region.

In step S208, information exemplified in FIG. 9B can be generated as a correction table. For example, an operation of positioning the substrate 8 concerning the Z direction by the substrate driving mechanism 5 such that a known defocus amount is generated and acquiring relative position information using the first detection system 211 of the detection device 3 can be executed for a plurality of defocus amounts. If the first detection system 211 or the detection device 3 has a focusing function (for example, a focusing lens), generation of the known defocus amount may be implemented by the focusing function. Pieces of relative position information obtained for the plurality of defocus amounts are approximated by a curve, thereby obtaining information (correction table) representing the relationship between the defocus amount and the measurement error.

In step S209, the mold 7 is separated from a pattern made of the cured product of the imprint material 9. After that, in step S210, the substrate 8 is unloaded. In step S211, the mold 7 is unloaded. Note that to increase the accuracy of the correction table, the same processes may be executed using a plurality of shot regions, and a correction table may be generated based on the result.

An article manufacturing method using an imprint apparatus represented by the above-described embodiment will be described next. The article can be, for example, a semiconductor device, a display device, a MEMS, or the like. The article manufacturing method can include a transfer step of transferring a pattern of an original to a substrate using a lithography apparatus or an imprint apparatus, and a processing step of processing the substrate so as to obtain an article from the substrate having undergone the transfer step. The transfer step can include a contact step of bringing the mold 7 and the imprint material 9 on the shot region of the substrate 8 into contact with each other. The transfer step can also include a measurement step of measuring the relative position between the mold 7 and the shot region (or the substrate mark) of the substrate 8. The transfer step can also include an alignment step of aligning the mold 7 and the shot region of the substrate 8 based on the result of the measurement step. The transfer step can also include a curing step of curing the imprint material 9 on the substrate 8 and a separation step of separating the imprint material 9 from the mold 7. This forms or transfers the pattern made of a cured product of the imprint material 9 on the substrate 8. The processing step can include, for example, etching, resist peeling, dicing, bonding, and packaging.

The pattern made of the cured product formed using the imprint apparatus is used permanently for at least some of various kinds of articles or temporarily when manufacturing various kinds of articles. The articles are an electric circuit element, an optical element, a MEMS, a recording element, a sensor, a mold, and the like. Examples of the electric circuit element are volatile and nonvolatile semiconductor memories such as a DRAM, an SRAM, a flash memory, and an MRAM and semiconductor elements such as an LSI, a CCD, an image sensor, and an FPGA. Examples of the mold are molds for imprint.

The pattern of the cured product is directly used as the constituent member of at least some of the above-described articles or used temporarily as a resist mask. After etching or ion implantation is performed in the substrate processing step, the resist mask is removed.

Figure 12A:
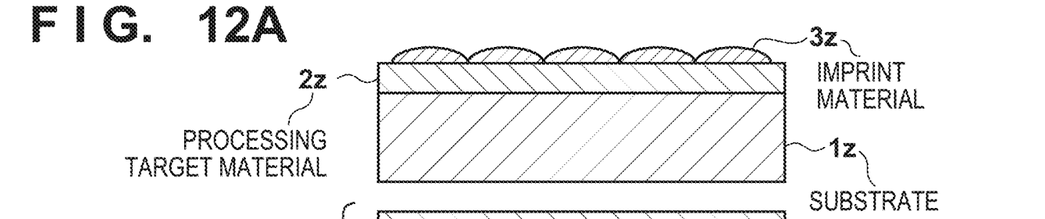
FIGS. 12A to 12F are views exemplifying an article manufacturing method.

An article manufacturing method in which an imprint apparatus forms a pattern on a substrate, processes the substrate on which the pattern has been formed, and manufactures an article from the processed substrate will be described next. As shown FIG. 12A, a substrate 1z such as a silicon wafer with a processed material 2z such as an insulator formed on the surface is prepared. Next, an imprint material 3z is applied to the surface of the processed material 2z by an inkjet method or the like. A state in which the imprint material 3z is applied as a plurality of droplets onto the substrate is shown here.

Figure 12B:
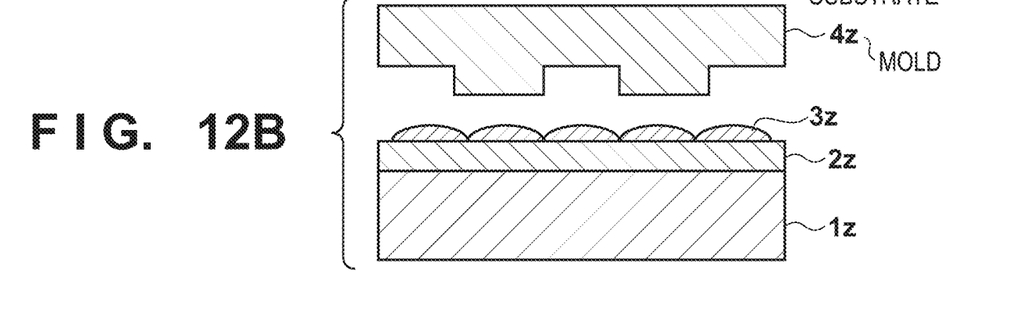
Figure 12C:
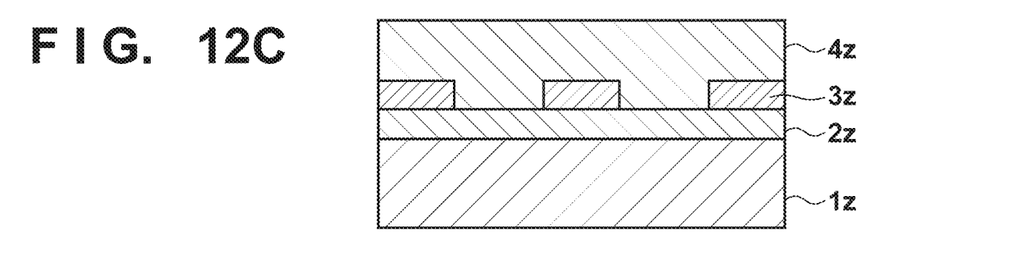

As shown in FIG. 12B, a side of a mold 4z for imprint with a concave-convex pattern is directed to face the imprint material 3z on the substrate. As shown FIG. 12C, the substrate 1z to which the imprint material 3z has been applied is brought into contact with the mold 4z, and a pressure is applied. The gap between the mold 4z and the processed material 2z is filled with the imprint material 3z. In this state, when the imprint material 3z is irradiated with light as curing energy via the mold 4z, the imprint material 3z is cured.

Figure 12D:
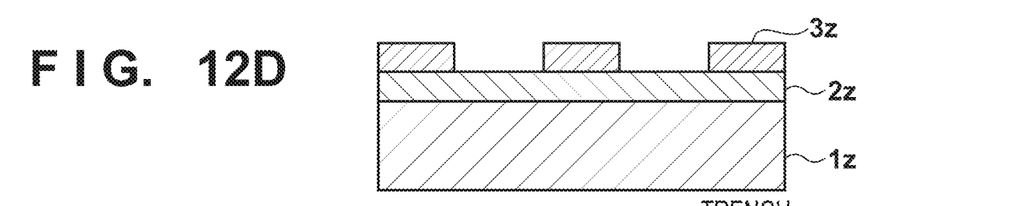

As shown in FIG. 12D, after the imprint material 3z is cured, the mold 4z is separated from the substrate 1z, and the pattern of the cured product of the imprint material 3z is formed on the substrate 1z. In the pattern of the cured product, the concave portion of the mold corresponds to the convex portion of the cured product, and the convex portion of the mold corresponds to the concave portion of the cured product. That is, the concave-convex pattern of the mold 4z is transferred to the imprint material 3z.

Figure 12E:
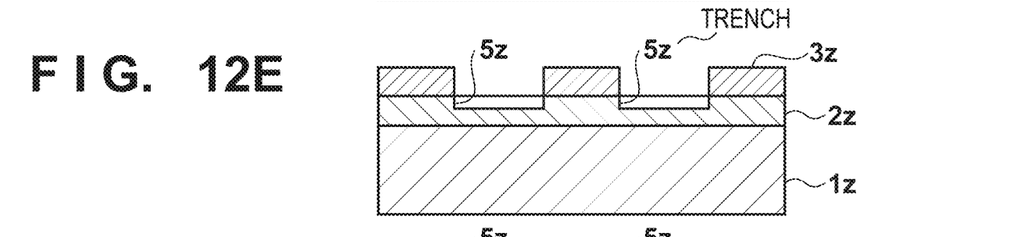
Figure 12F:
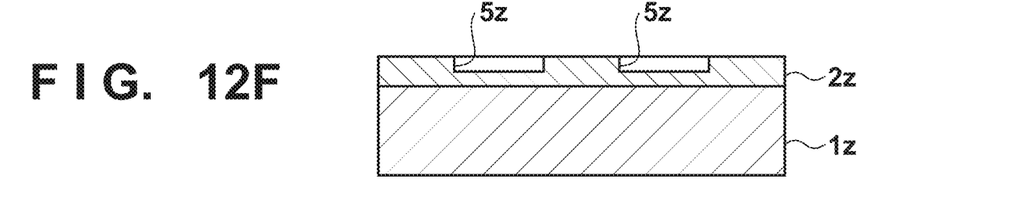

As shown in FIG. 12E, when etching is performed using the pattern of the cured product as an etching resistant mask, a portion of the surface of the processed material 2z where the cured product does not exist or remains thin is removed to form a groove 5z. As shown in FIG. 12F, when the pattern of the cured product is removed, an article with the grooves 5z formed in the surface of the processed material 2z can be obtained. Here, the pattern of the cured product is removed. However, instead of removing the pattern of the cured product after the process, it may be used as, for example, an interlayer dielectric film included in a semiconductor element or the like, that is, a constituent member of an article.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2022-133518, filed Aug. 24, 2022, which is hereby incorporated by reference herein in its entirety.

What is claimed is:

1. A detection device for detecting a relative position between a first mark provided on a first object and a second mark provided on a second object, which are arranged to be superimposed, the detection device comprising:
an illumination system configured to illuminate the first mark and the second mark with first illumination light;
a first detection system including a first image sensor and a first aperture stop and configured to form images of diffracted lights from the first mark and the second mark illuminated with the first illumination light by the illumination system on an imaging surface of the first image sensor via the first aperture stop,
wherein the first illumination light forms a first light intensity distribution asymmetric with respect to an optical axis of the illumination system on a pupil surface of the illumination system, or the first aperture stop is asymmetric with respect to an optical axis of the first detection system; and
a processor configured to obtain:
an index value having correlation with defocus amounts of the first mark and the second mark in the first detection system; and
the relative position between the first mark and the second mark by correcting relative position information between the first mark and the second mark obtained from the images of the first mark and the second mark captured by the first image sensor, using a correction value corresponding to the obtained index value.

2. The device according to claim 1, wherein the first mark and the second mark are each a diffraction grating configured to generate a moiré fringe.

3. The device according to claim 1, wherein:
the first illumination light forms a first light intensity distribution asymmetric with respect to an optical axis of the illumination system on a pupil surface of the illumination system, and
the first aperture stop is asymmetric with respect to an optical axis of the first detection system.

4. A lithography apparatus for transferring a pattern of an original to a substrate, the lithography apparatus comprising:
a detection device defined in claim 1,
wherein the lithography apparatus is configured to align the original as a first object provided with a first mark and the substrate as a second object provided with a second mark based on an output from the detection device.

5. The apparatus according to claim 4, wherein the lithography apparatus is formed as an imprint apparatus.

6. An article manufacturing method comprising:
transferring a pattern of an original to a substrate using a lithography apparatus defined in claim 5; and
processing the substrate so as to obtain an article from the substrate having undergone the transferring.

7. A detection device for detecting a relative position between a first mark provided on a first object and a second mark provided on a second object, which are arranged to be superimposed, wherein a third mark is provided on the first object and a fourth mark is provided on the second object, the detection device comprising:
an illumination system configured to illuminate the first mark, the second mark, third mark, and the fourth mark with first illumination light;
a first detection system including a first image sensor and a first aperture stop, and configured to form images of diffracted lights from the first mark and the second mark illuminated with the first illumination light by the illumination system on an imaging surface of the first image sensor via the first aperture stop;
a second detection system including a second image sensor and a second aperture stop, wherein
the second detection system forms images of lights from the third mark and the fourth mark illuminated with the second illumination light by the illumination system on an imaging surface of the second image sensor via the second aperture stop, wherein the first illumination light forms a first light intensity distribution asymmetric with respect to an optical axis of the illumination system on a pupil surface of the illumination system, or the first aperture stop is asymmetric with respect to an optical axis of the first detection system, and wherein the second illumination light forms a second light intensity distribution on the pupil surface of the illumination system, asymmetry of the second light intensity distribution with respect to the optical axis is different from asymmetry of the first light intensity distribution with respect to the optical axis, or asymmetry of the second aperture stop with respect to the optical axis of the second detection system is different from asymmetry of the first aperture stop with respect to the optical axis of the first detection system; and a processor configured to:
  determine an index value having correlation with defocus amounts of the first mark and the second mark in the first detection system based on a center-of-gravity position of the images of the first mark and the second mark captured by the first image sensor and a center-of-gravity position of the images of the third mark and the fourth mark captured by the second image sensor; and
  obtain the relative position between the first mark and the second mark based on an output of the first image sensor and the determined index value.

8. The device according to claim 7, wherein:
the second illumination light forms the second light intensity distribution on the pupil surface of the illumination system, and
the second light intensity distribution is symmetric with respect to the optical axis of the illumination system.

9. The device according to claim 7, wherein the processor obtains the relative position by correcting relative position information between the first mark and the second mark obtained from the images of the first mark and the second mark captured by the first image sensor based on a correction value corresponding to the determined index value.

10. The device according to claim 9, wherein the processor determines the correction value corresponding to the determined index value using first information representing a relationship between the index value and the defocus amount and second information representing a relationship between the defocus amount and the correction value.

11. The device according to claim 9, wherein the processor determines:
the defocus amount corresponding to the determined index value using first information representing a relationship between the index value and the defocus amount; and
the correction value corresponding to the determined defocus amount using second information representing a relationship between the defocus amount and the correction value.

12. The device according to claim 11, wherein the processor acquires the relative position information while changing the defocus amounts of the first mark and the second mark in the first detection system, and generates the second information.

13. The device according to claim 7, wherein the illumination system includes a diffraction optical element configured to generate the first illumination light and the second illumination light.

14. The device according to claim 13, wherein the diffraction optical element is arranged on a surface conjugate with respect to a surface between the first object and the second object.

15. The device according to claim 14, wherein:
the diffraction optical element includes a first region and a second region, which do not overlap each other, and
the first illumination light passes through the first region, and the second illumination light passes through the second region.

16. The device according to claim 7, wherein:
the first light intensity distribution has a single pole, and
the second light intensity distribution has a plurality of poles.

17. The device according to claim 7, wherein:
the first aperture stop is asymmetric with respect to the optical axis of the first detection system, and
the second aperture stop is symmetric with respect to the optical axis of the second detection system.

18. The device according to claim 17, wherein the first aperture stop shields light on the optical axis of the first detection system.

19. A detection method for detecting a relative position between a first mark provided on a first object and a second mark provided on a second object, which are arranged to be superimposed, the detection method comprising:
  while illuminating the first mark and the second mark with illumination light from an illumination system, forming, by a detection system including an image sensor and an aperture stop, images of diffracted lights from the first mark and the second mark illuminated with the illumination light on an imaging surface of the image sensor via the aperture stop; and
  wherein the illumination light forms a light intensity distribution asymmetric with respect to an optical axis of the illumination system on a pupil surface of the illumination system, or the aperture stop is asymmetric with respect to an optical axis of the detection system; and
  obtaining an index value having correlation with defocus amounts of the first mark and the second mark in the detection system; and
  obtaining the relative position between the first mark and the second mark by correcting relative position information between the first mark and the second mark obtained from the images of the first mark and the second mark captured by the first image sensor, using a correction value corresponding to the obtained index value.

* * * * *